United States Patent [19]

Doi et al.

[11] Patent Number: 4,868,252

[45] Date of Patent: Sep. 19, 1989

[54] EPOXY RESIN COMPOSITION

[75] Inventors: Takao Doi, Yokohama; Yutaka Yamada, Tokyo; Shigeyuki Kozawa, Yokohama, all of Japan

[73] Assignee: Asahi Glass Company Ltd., Tokyo, Japan

[21] Appl. No.: 54,506

[22] Filed: May 27, 1987

[30] Foreign Application Priority Data

May 27, 1986 [JP] Japan ................................. 61-120060

[51] Int. Cl.$^4$ ...................... C08F 283/10; C08L 63/10
[52] U.S. Cl. .................................. 525/530; 525/531; 525/488
[58] Field of Search ........................ 525/530, 531, 488

[56] References Cited

U.S. PATENT DOCUMENTS 3,901,864  8/1975  Jäger ..................................... 526/246
4,284,747  8/1981  Griffith et al. ....................... 525/530

FOREIGN PATENT DOCUMENTS 60-40161  3/1985  Japan .

OTHER PUBLICATIONS

*Chemical Abstracts,* vol. 105, No. 10, Abstract No. 80814t, p. 105, Endo et al., "Oil and Water-Repelling Coating Materials".

*Primary Examiner*—John C. Bleutge
*Assistant Examiner*—Robert E. L. Sellers, II
*Attorney, Agent, or Firm*—Oblon, Spivak, McClelland, Maier & Neustadt

[57] ABSTRACT

An epoxy resin composition comprising an epoxy resin and a polyfluoroalkyl group-containing polymer uniformly dispersed therein, said polymer having been formed by polymerizing a polyfluoroalkyl group-containing polymerizable compound in said epoxy resin.

7 Claims, No Drawings

EPOXY RESIN COMPOSITION

BACKGROUND OF THE INVENTION

1. Field of the Invention:

The present invention relates to an epoxy resin composition wherein a polymer of a polyfluoroalkyl group-containing polymerizable compound, is dispersed in a particulate form.

2. Discussion of the Background:

Cured epoxy resins have excellent electrical properties, adhesion, chemical resistance and toughness, and they are widely used as coating materials, electrical insulating materials, lamination materials, structural materials or construction and building materials. However, commonly employed cured products of epoxy resins inherently have OH groups and high polarity, whereby the moisture absorptivity and water absorptivity are high. Therefore, their properties are not necessarily satisfactory for application to coatings where moisture is unwanted or for application to electrical insulating materials. In order to overcome such drawbacks, it has been attempted to apply various fluorine-type compounds to the surface of the cured products, but no adequate moisture resistance and water resistance have not been obtained.

With the foregoing technical background, the present inventors have conducted various studies to develop an epoxy resin composition having excellent moisture and water resistance.

As a method for improving the moisture and water resistance of a cured product of an epoxy resin, an attempt has been made to blend a fluorinated oligomer to an epoxy resin. For example, Japanese Unexamined Patent Publication No. 40161/1985 discloses a method wherein a polyfluoroalkyl group-containing acrylate or methacrylate oligomer is blended to various resins to improve the moisture resistance. However, in this method, the polyfluoroalkyl group-containing oligomer is added to a resin for blending, whereby dispersion of the oligomer in the resin is not necessarily adequately uniform, and there will be non-uniformity in the moisture and water resistance. Thus, such a method can hardly be regarded as being satisfactory.

SUMMARY OF THE INVENTION

The present inventors have conducted extensive studies for epoxy resin compositions having excellent moisture and water resistance, and as a result have found that the moisture and water resistance of an epoxy resin composition can be improved by polymerizing a polyfluoroalkyl group-containing polymerizable compound in an epoxy resin to obtain an epoxy resin composition wherein a polyfluoroalkyl group-containing polymer is uniformly dispersed, as opposed to the conventional manner wherein a polyfluoroalkyl group-containing acrylate or methacrylate oligomer is simply added to an epoxy resin for blending. The present invention has been accomplished on the basis of this discovery.

Thus, the present invention provides an epoxy resin composition comprising an epoxy resin and a polyfluoroalkyl group-containing polymer uniformly dispersed therein, said polymer having been formed by polymerizing a polyfluoroalkyl group-containing polymerizable compound in said epoxy resin.

DETAILED DESCRIPTION OF THE PREFERRED EMBODIMENTS

Now, the present invention will be described in detail with reference to the preferred embodiments.

Either ionic polymerization or radial polymerization may be employed as a method for polymerizing the polyfluoroalkyl group-containing polymerizable compound in the epoxy resin. However, radical polymerization is preferred in that the catalyst residue hardly affects the curing of the epoxy resin. A particulate copolymer having a particle size of from about 0.01 to 100 μm can be obtained by either method of polymerization.

There is no particular restriction as to the polyfluoroalkyl group-containing polymerizable compound, so long as it is capable of being polymerized in the epoxy resin. However, the following unsaturated esters are preferred.

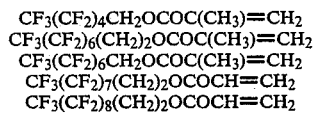

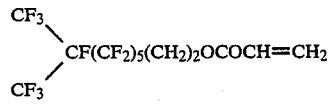

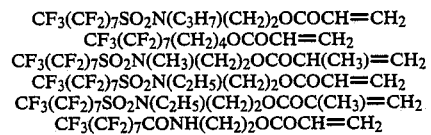

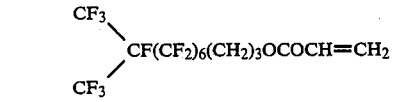

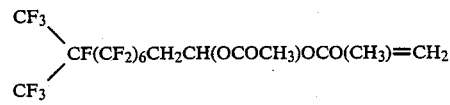

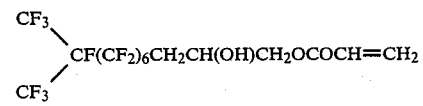

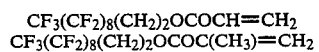

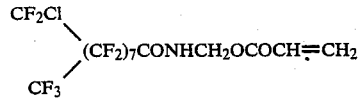

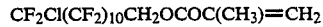

The carbon number of the polyfluoroalkyl group may be selected within a range of from 3 to 21. If the carbon number is too small, the fluorine content in the polymer will be small, whereby the contribution to the moisture resistance will be small. On the other hand, if the carbon number is too large, the proportion of double bonds for polymerization will be too small. A preferred range of the carbon number is from 3 to 15. The polyfluoroalkyl group preferably contains a perfluoroalkyl group having from 3 to 21 carbon atoms at its terminal, but it may be substituted by an element other than fluorine within a range of from 20 to 50% by weight. Further, in the polymerization, it is also possible to simultaneously use a polyfluoroalkyl group-containing acrylate and/or methacrylate. Furthermore, the polymer of the present invention is not restricted to a polymer of a fluoroalkyl group-containing acrylate and/or methacrylate monomer only, but it may be a copolymer obtained by using various copolymerizable monomers in a copolymerization rate of from 5 to 95% by weight. As such copolymerizable monomers, a diene monomer such as butadiene or isoprene, a styrene derivative such as styrene or methyl styrene, an alkyl acrylate such as methyl acrylate, an alkyl methacrylate such as methyl methacrylate, a vinyl ester such as vinyl acetate, a vinyl ether such as vinyl methyl ether, a vinyl ketone such as vinyl methyl ketone, a vinyl halide such as vinyl chloride, and others such as acrylamide, N-vinylpyrrolidone, vinylimidazole, vinylpyridine, dialkyl maleate or allyl alcohol, may be mentioned. The above monomers may be used in a combination of at least two different kinds, in order to obtain the copolymer.

Further, the dispersion stability and strength of the polyfluoroalkyl group-containing polymer and the epoxy resin can be improved by introducing graft sites by using a monomer capable of contributing to both the polymerization of a polyfluoroalkyl group-containing polymerizable compound and the curing of the epoxy resin, such as glycidyl methacrylate, isocyanatoethyl methacrylate, acrylic acid, methacrylic acid, maleic anhydride or itaconic acid, so that the polymer and the epoxy resin are partially chemically bonded to each other. The particle size of the polyfluoroalkyl group-containing polymer can also be made as fine as from about 0.01 to 1.0 μm. Furthermore, bleeding out of the copolymer on the surface of the epoxy resin will be proper, and the durability of the moisture and water resistance will be improved. Such a monomer may be reacted simultaneously with the polyfluoroalkyl group-containing polymerizable compound and the epoxy resin. Otherwise, it may be reacted first with the epoxy resin to introduce functional groups capable of being chemically bonded with the polyfluoroalkyl group-containing polymer, followed by the reaction with the polymerizable compound. Or, it is also possible to use an epoxy resin having such functional groups.

A distinct effect will be obtained even when the content of the fluoroalkyl group-containing polymerizable compound in the copolymer is small. However, the weight ratio of the above monomer in the copolymer is preferably at least 1%, preferably at least 5%.

The copolymer in the present invention ranges from an oligomer having a molecular weight of not higher than 10,000 to a polymer having a higher molecular weight. In order to obtain an oligomer, a chain transfer agent containing a mercapto group such as $HSC_2H_4OH$, $HSCH_2COOH$, $HSC_8H_{17}$, $HSC_{12}H_{25}$, $HSC_2H_4C_8F_{17}$ and $HSC_2H_4COOC_2H_4C_8F_{17}$, may preferably be employed.

The weight ratio of the epoxy resin to the polyfluoroalkyl group-containing polymer is within a range of from 40:60 to 99:1, preferably from 50:50 to 95:5. If the epoxy resin is less, the heat resistance tends to be impaired. On the other hand, if it is excessive, no adequate moisture and water resistance will be obtained.

As a catalyst to be used for the polymerization of the above-mentioned monomer, a peroxide such as a persulfate or benzoyl peroxide or an azo compound such as azobisisobutyronitrile may be employed for the radical polymerization, and a catalyst for cation polymerization such as boron trifluoride or a catalyst for anion polymerization such as metal sodium or alkyl lithium, may be employed for the ion polymerization.

A solvent may be used as the case requires. However, in a case where the polymerization is conducted in a liquid epoxy resin or a molten epoxy resin, the epoxy resin itself serves as a solvent, and no other solvent may be required.

As the epoxy resin, a compound having at least one epoxy group, particularly at least two epoxy groups, may be employed. For example, a bisphenol A type, a bisphenol F type, a halogenated bisphenol type, a resorcinol-type, a phenol novolak type, a cresol, novolak type, a polyalcohol type, glycerol ether type, a polyolefin type, a soybean oil type, an alicyclic type, triglycidyl isocyanurate and bromides thereof for flame retardancy, may be mentioned.

As the curing agent, a $BF_3$ compound, dicyandiamide, an amine curing agent, a polyamide resin or an acid anhydride curing agent may be employed. Further, a curing accelerator such as benzyldimethylamine may also be employed.

Further, various subsidiary blending materials may be added for the modification of the resin, for instance, a reactive diluent such as phenylglycidyl ether or styrene oxide, a non-reactive diluent such as dibutyl phthalate or tricresyl phosphate, a filler such as silica, talc, asbestos, glass fiber, carbon fiber, various ceramic fibers or alamido fibers, a pigment, or a resin modifier such as a polysulfide resin, may be mentioned. The cured product of the epoxy resin having excellent moisture and water resistance thus obtained provides excellent properties for coating materials, various electrical applications such as printed circuit boards or sealing resins, laminated products, adhesive agents, molding materials, or solder resist ink materials.

Now, the present invention will be described in further detail with reference to Examples. However, it should be understood that the present invention is by no means restricted to such specific Examples.

EXAMPLE 1

Into a 300 ml two-necked flask equipped with a mechanical stirrer and a Dimroth condenser, 75 g of Epikote 828 (bisphenol A type epoxy resin, manufactured by Yuka Shell Epoxy K.K.), 29 g of $CH_2=C(CH_3)COOC_2H_4C_4F_9$ and 0.1 g of azobisisobutyronitrile were charged, and stirred at 60° C. for 20 hours. As the reaction proceeded, the system turned white, and upon expiration of 20 hours, a milky white viscous composition was obtained. This composition had relatively good storage stability. Slight sedimentation of particles was observed when the composition was left to stand for 1 month. However, by stirring again, it readily formed a uniform composition again. 13.9 g of this composition having an epoxy equivalent of 270, 8 g of methyl nadic anhydride and 0.1 g of benzyldimethylamine were uniformly mixed to obtain Composition I.

EXAMPLE 2

Into a 300 ml three-necked flask equipped with a mechanical stirrer, a Dimroth condenser and a dropping funnel, 80 g of Epikote 1001 (bisphenol A type epoxy resin, manufactured by Yuka Shell Epoxy K.K.) and 2 g of isocyanatoethyl methacrylate were charged, and reacted at 80° C. for 5 hours. Then, a solution obtained by dissolving 1 g of azobisisobutyronitrile in 50 g of methyl isobutyl ketone is mixed with 29 g of $CH_2=C(CH_3)COOC_2H_4N(C_2H_5)SO_2C_8F_{17}$, and the mixture was dropwise added from the dropping funnel into the flask heated to 100° C., over a period of 1 hour. After the completion of the dropwise addition, the reaction was further continued at 100° C. for 1 hour to obtain a milky white viscous liquid.

This composition had excellent storage stability, and no sedimentation of particles was observed even when it was left to stand for 1 month. The solvent was removed from this composition under reduced pressure, and 50 g of the composition thus obtained was mixed under heating with 20 g of phenylglydicyl ether to obtain a composition having an epoxy equivalent of 320. 17.1 g of this composition was uniformly mixed with 7.5 g of methylhexahydrophthalic anhydride and 0.1 g of benzyldimethylamine to obtain Composition II.

COMPARATIVE EXAMPLE 1

18.6 g of Epikote 828, 8 g of methyl nadic anhydride and 0.1 g of benzyldimethylamine were uniformly mixed to obtain Composition III.

COMPARATIVE EXAMPLE 2

80 g of Epikote 1001 and 20 g of phenylglycidyl ether were mixed under heating to obtain a composition having an epoxy equivalent of 320. Then, 17.1 g of this composition was uniformly mixed with 7.5 g of methylhexahydrophthalic anhydride and 0.1 g of benzyldimethylamine to obtain Composition IV.

COMPARATIVE EXAMPLE 3

To 100 of Composition IV obtained in Comparative Example 2, 3 g of a perfluoroalkyl group-containing acrylate oligomer (molecular weight: about 3,000) was added to obtain Composition V. If the above oligomer is incorporated more than 3 g, a cast plate of such a composition will have stickiness on its surface due to the bleeding out.

Each of the compositions obtained in the above Examples and Comparative Examples, was defoamed and then poured into a casting mold prepared by arranging a pair of glass sheets each lined with a fluoro resin sheet, so that the lined sheet surfaces faced each other with a space of 3 mm i.e. with a PTFE spacer having a thickness of 3 mm, and cured under heating at 150° C. for 5 hours to obtain a cast plate.

Each cast plate was cut into a sample of 30×50 mm, and the water absorptivity (%) of this sample was measured after boiling for 3 hours and 6 hours. The results are shown in Table 1.

TABLE 1

| Composition | 3 hours | 6 hours | 50 hours |
|---|---|---|---|
| I | +0.82 | +0.95 | +1.08 |
| II | +0.89 | +1.01 | +1.14 |
| III | +0.98 | +1.30 | +1.88 |
| IV | +0.94 | +1.24 | +1.81 |
| V | +0.92 | +1.21 | +1.35 |

EXAMPLE 3

Into a 300 ml two-necked flask equipped with a mechanical stirrer and a Dimroth condenser, 95 g of Epikote 828 and 1.0 g of acrylic acid were charged, and reacted at 80° C. for 5 hours. Then, 6.0 g of $CH_2=CHCOOC_2H_4C_9F_{19}$ and 0.5 g of benzoyl peroxide were added thereto and reacted at 100° C. for 2 hours to obtain a milky white viscous liquid.

The epoxy resin composition thus obtained and Basamide 140 (amine value: 395, manufactured by Henkel Hakusuisha) as a curing agent were mixed so that the epoxy equivalent and the amine equivalent would be equal, whereby an adhesive composition was obtained.

By using this adhesive composition, the tensile shearing strength of aluminum-aluminum was measured in accordance with JIS K6850. The results are shown in Table 2.

EXAMPLE 4

The same operation as in Example 3 was conducted except that the amount of $CH_2=CHCOOC_2H_4C_9F_{19}$ in Example 3 was changed to 12.0 g.

EXAMPLE 5

The same operation as in Example 3 was conducted except that the fluoroacrylate of Example 3 was changed to 6.7 g of $CH_2=C(CH_3)COOCH_2C_5F_{11}$.

COMPARATIVE EXAMPLE 4

The same operation as in Example 3 was conducted except that the fluoroacrylate and the benzoyl peroxide used in Example 3 were not added.

COMPARATIVE EXAMPLE 5

The same operation as in Example 3 was conducted except that 12.0 g of dodecyl acrylate was used instead of the fluoroacrylate in Example 3.

TABLE 2

| | Monomer | F content (%) | Tensile shear strength (kg/cm$^2$) Initial | After immersion in hot water at 60° C. for 15 hours. | Strength retaining rate (%) |
|---|---|---|---|---|---|
| Example 3 | $CH_2=CHCOOC_2H_4C_9F_{19}$ | 2.8 | 95 | 81 | 85 |
| Example 4 | " | 5.1 | 150 | 140 | 93 |
| Example 5 | $CH_2=C(CH_3)COOCH_2C_5F_{11}$ | 2.8 | 91 | 75 | 82 |
| Comparative Example 4 | — | 0 | 85 | 65 | 76 |
| Comparative Example 5 | $CH_2=CHCOOC_{12}H_{25}$ | 0 | 90 | 64 | 71 |

As described in the foregoing, according to the present invention, an epoxy resin composition wherein fluorine-containing polymer particles are uniformly dispersed, can be obtained by forming the fluorine-containing polymer particles in an epoxy resin, and a cured product thereof has excellent moisture and water resistance with other physical properties such as heat resistance being maintained. Accordingly, the composition of the present invention is extremely useful for various applications where moisture and water resistance is required. Further, the epoxy resin composition of the present invention wherein fluorine-containing polymer particles are dispersed, has excellent storage stability and molding processability.

We claim:

1. An epoxy resin composition, comprising an epoxy resin and a polyfluoroalkyl group-containing polymer uniformly dispersed therein, wherein said polymer is obtained by polymerizing a polyfluoroalkyl group-containing polymerizable compound in said epoxy resin; wherein said polyfluoroalkyl group contains a perfluoroalkyl group having from 3 to 21 carbon atoms at its terminal, and wherein said polymerizable compound is a polyfluoroalkyl group-containing unsaturated ester.

2. The epoxy resin composition according to claim 1, wherein a part of said polymer is chemically bonded to said epoxy resin.

3. The epoxy resin composition according to claim 2, wherein the epoxy resin has a functional group capable of being chemically bonded to said polymer.

4. The epoxy resin composition according to claim 1, wherein said polymer has a particle size of from 0.01 to 100 μm.

5. The epoxy resin composition according to claim 1, wherein the weight ratio of the epoxy resin to the polymer is within a range of from 40:60 to 99:1.

6. The epoxy resin composition of claim 1, wherein said polyfluoroalkyl group-containing unsaturated ester contains, as atoms or groups, only carbon atoms, hydrogen atoms, fluorine atoms, chlorine atoms, nitrogen atoms, and SO$_2$ groups.

7. The epoxy resin composition of claim 1, wherein said unsaturated ester is at least one member selected from the group consisting of $CF_3(CF_2)_3(CH_2)_2OCOC(CH_3)=CH_2$, $CF_3(CF_2)_4CH_2OCOC(CH_3)=CH_2$,
$CF_3(CF_2)_6(CH_2)_2OCOC(CH_3)=CH_2$,
$CF_3(CF_2)_6CH_2OCOC(CH_3)=CH_2$,
$CF_3(CF_2)_7(CH_2)_2OCOCH=CH_2$,
$CF_3(CF_2)_8(CH_2)_2OCOCH=CH_2$, $(CF_3)_2CF(CF_2)_5(CH_2)_2OCOCH=CH_2$, $CF_3(CF_2)_7SO_2N(C_3H_7)(CH_2)_2OCOCH=CH_2$,
$CF_3(CF_2)_7(CH_2)_4OCOCH=CH_2$,
$CF_3(CF_2)_7SO_2N(CH_3)(CH_2)_2OCOCH(CH_3)=CH_2$,
$CF_3(CF_2)_7SO_2N(C_2H_5)(CH_2)_2OCOCH=CH_2$,
$CF_3(CF_2)_7SO_2N(C_2H_5)(CH_2)_2OCOC(CH_3)=CH_2$,
$CF_3(CF_2)_7CONH(CH_2)_2OCOCH=CH_2$, $(CF_3)_2CF(CF_2)_6(CH_2)_3OCOCH=CH_2$, $(CF_3)_2CF(CF_2)_6CH_2CH(OCOCH_3)OCO(CH_3)=CH_2$, $(CF_3)_2CF(CF_2)_6CH_2CH(OH)CH_2OCOCH=CH_2$, $CF_3(CF_2)_8(CH_2)_2OCOCH=CH_2$,
$CF_3(CF_2)_8(CH_2)_2OCOC(CH_3)=CH_2$, $CF_2Cl(CF_3)CF(CF_2)_7CONHCH_2OCOCH=CH_2$, $H(CF_2)_{10}CH_2OCOCH=CH_2$, and $CF_2Cl(CF_2)_{10}CH_2OCOC(CH_3)=CH_2$.

* * * * *